United States Patent [19]

Payne

[11] Patent Number: 4,964,919

[45] Date of Patent: Oct. 23, 1990

[54] CLEANING OF SILICON WAFERS WITH AN AQUEOUS SOLUTION OF KOH AND A NITROGEN-CONTAINING COMPOUND

[75] Inventor: Charles C. Payne, Aurora, Ill.

[73] Assignee: Nalco Chemical Company, Naperville, Ill.

[21] Appl. No.: 291,129

[22] Filed: Dec. 27, 1988

[51] Int. Cl.$^5$ ............................ B08B 3/08; C11D 7/06; C11D 7/32; C11D 7/34

[52] U.S. Cl. .......................................... 134/2; 134/38; 134/42; 252/79.1; 252/79.5; 252/156; 252/173; 252/541; 252/545; 252/547; 252/DIG. 14; 430/327; 430/331

[58] Field of Search ............................ 134/2, 38, 42; 252/79.1, 79.5, 156, 173, 541, 545, 547, DIG. 14; 430/327, 331

[56] References Cited

U.S. PATENT DOCUMENTS

| | | | |
|---|---|---|---|
| 3,607,477 | 9/1971 | Rao | 252/79.5 |
| 3,765,969 | 10/1973 | Kragness | 252/79.5 |
| 4,113,551 | 9/1978 | Bassous | 252/79.5 |
| 4,129,457 | 12/1978 | Basi | 134/2 |
| 4,156,619 | 5/1979 | Greisshammer | 134/2 |
| 4,202,703 | 5/1980 | Zuber | 134/2 |
| 4,261,791 | 4/1981 | Shwartzman | 252/79.3 |
| 4,264,374 | 4/1981 | Beyer | 134/3 |
| 4,276,186 | 6/1981 | Bakos | 252/158 |
| 4,430,152 | 2/1984 | Okano | 134/2 |
| 4,462,188 | 7/1984 | Payne | 252/155 |
| 4,518,675 | 5/1985 | Kataoka | 430/256 |
| 4,686,002 | 8/1987 | Tasset | 134/2 |
| 4,758,368 | 7/1988 | Thompson | 252/79.5 |
| 4,778,532 | 10/1988 | McConnell | 134/10 |
| 4,781,764 | 11/1988 | Leenaars | 134/34 |
| 4,828,751 | 5/1989 | Kremer | 252/171 |

OTHER PUBLICATIONS

Weiss, A. D., "Wafer Cleaning Update", *Semiconductor International*, Apr. 1984, p. 82.

Skidmore, K., "Cleaning Techniques for Wafer Surfaces", *Semiconductor International*, Aug. 1987, 6 pages.

Bowling, R. Allen, "An Analysis of Particle Adhesion on Semiconductor Surfaces", *J. Electrochem Soc.*, Sep. 1985, pp. 2208–2214.

*Primary Examiner*—Dennis Albrecht
*Attorney, Agent, or Firm*—Kinzer, Plyer, Dorn, McEachran & Jambor

[57] ABSTRACT

Composition of matter and method of cleaning silicon wafers; the composition of matter is an aqueous solution of potassium hydroxide and a nitrogen-containing compound, preferably tetramethylammonium hydroxide. The wafer is immersed in the solution, rinsed and dried.

2 Claims, No Drawings

CLEANING OF SILICON WAFERS WITH AN AQUEOUS SOLUTION OF KOH AND A NITROGEN-CONTAINING COMPOUND

This invention relates to a composition of matter and use therefore to insure a high degree of particle free silicon semiconductor wafers.

BACKGROUND

Fine particulates which adhere to a silicon semiconductor surface can reduce the yield or efficiency of the wafer as can be well imagined. These particles will adhere to one another, creating larger size particles termed agglomerates. The origins of the particles are literally too numerous to list: dust, pollen, flakes of human skin, oxides, etc, as well as debris from slicing and lapping operations.

The primary holding forces are van der Waals forces and electrostatic forces. Chemical bonding may also prevail. Numerous methods have heretofore been proposed for reducing or purging the particles: filtering the air in the production facility, personal fastidiousness, spinning the wafer to centrifuge the particles, immersing the wafer in a liquid to reduce adhesion, and so on. Immersion, however, can introduce another force, namely capillary attraction upon removal of the wafer from the immersion bath.

The foregoing background is set forth in more detail in an article entitled "An Analysis of Particle Adhesion on Semiconductor Surfaces," R. Allen Bowling in SOLID-STATE SCIENCE AND TECHNOLOGY, September 1985, presenting the ultimate conclusion that emphasis should be placed on prevention of particle deposition in the first place rather than relying on subsequent removal efforts.

The article by R. Allen Bowling takes into account an earlier investigation of detergent cleaning, both aqueous and nonaqueous, as a means of removing the offending particles, but this technique did not alter the author's conclusion. Indeed, the author stressed criticality of the size of detergent molecules, which must be small enough to wedge between the offending particles and the silicon surface, meaning that effective removal by detergents would involve relations between the size of the offending particle and the size of the detergent molecule.

Detergents are organic in nature; many are of a polar nature and themselves tend to bond to the wafer chemically as noted in a recent article, "Cleaning Techniques for Wafer Surfaces" (Semi-International, 1987). This same article stresses use of ultrasonics and megasonics as aids in chemical cleaning, deemed especially helpful in loosening polar bonds such as those which can arise from the use of peroxides; for example, ammonium hydroxide-peroxide solutions are employed to break the strong electrical particle bonds.

The 1987 article concludes by updating chemical cleaning, also known as wet chemistry. Considerable detail is presented in terms of the complex mechanics employed for wet chemistry (immersion bath equipment, centrifugal spray equipment, and so on). Few details of chemistry are discussed, only generalities for the most part, such as "acids," "oxygen plasmas," "choline chemistry" and "RCS chemistry." Choline chemistry, because of its foul odor presents a handling problem. Therefore it is reluctantly accepted provided a closed system is adopted. The so-called "RCA chemistry" involves two aqueous systems applied in sequence, namely, an $NH_4OH/H_2O_2$ treatment followed by an $HCl/H_2O_2$ treatment. The solutions are volatile, giving off noxious fumes which, if they mix, result in settlement of $NH_4Cl$ particles. Other problems are discussed. Processing the wafer by methods described above depends a great deal upon whether the wafer is one freshly sliced from the rod of crystals on which it grew or whether it is a wafer which has undergone subsequent IC fabrication such as resist coating, photolithography, insertion of conductor pins and so on. Thus, one can compare the disclosure in U.S. Pat. No. 4,159,619 which addresses prefabrication surfactant cleaning of freshly sliced, polished wafers and the disclosure in U.S. Pat. No. 4,276,186 where the concern is with an effort to purge an IC module of solder flux residue and to remove from the chip the so-called top seal material. Many chemicals when used by themselves tend to objectionably discolor and etch the wafer surface; hence great care is required. Discoloration of the wafer is perceived by the electronics industry as a possible source of electrical problems. Among these are potassium hydroxide and choline hydroxide.

The present invention is concerned with the first of these general procedures, that is, cleaning a silicon wafer freshly sliced from the long rod where it was grown. After slicing the wafer, it is ordinarily subjected to rough lapping, and then progressively finer polishing to render the opposed surfaces as flat and parallel as possible. The residues or soil to be removed are "particulate," that is, adherent particles of silicon and polishing materials left over from the lapping and polishing procedures.

THE OBJECTIVES OF THE PRESENT AND ITS CHARACTER

In light of the foregoing the objects of the present invention are to establish that subsequent removal of offending (yield-reducing) particles from a silicon wafer can be accomplished in a practical and efficient manner in an open system without encountering obnoxious circumstances, that chemical cleaning by immersion in accordance with the foregoing object can be accomplished with a simple but effective coupling of two water-soluble chemicals in a small concentration which exhibit little (if no) tendency to cling by capillary attraction, that this chemical mixture (two bases) is effective in a one-step process not dependent on expensive or complicated mechanical devices such as ultrasonic equipment, centrifuge equipment, and so on, which can cause damage to the silicon surface, and that certain chemicals having a bad reputation for immersion cleaning when used by themselves can be rehabilitated when used in combination.

SUMMARY OF THE INVENTION

The foregoing objectives are accomplished by employing a weak water solution of potassium hydroxide and one of several selected mitrogen-containing compounds. This aqueous immersion solution results in nearly 100% brightness (reflectivity is universally a measure of surface cleanliness in the electronics industry) and leaves an acceptably smooth surface as measured by a profilometer.

The surprising and unexpected result is the lack of surface roughness (too much etching) which is ordinarily encountered from the use of potassium hydroxide by itself. When combined with a small amount of one of several nitrogen-containing compounds featured under the present invention, the proclivity of potassium hydroxide to produce surface roughness is greatly diminished.

The species are all aqueous solutions of potassium hydroxide with the nitrogen-containing compound added. The most preferred species contains tetramethylamonium hydroxide (TMA); the next in preference contains taurine which is more expensive. Substances like glycine can produce smooth surfaces; however, its use results in some discoloration of the wafer.

PROCEDURE

A typical silicon wafer to be cleaned is circular in shape except for the primary and secondary flats. The diameter of the wafer is typically 2 inches, up to 8 inches, and is generally about 20-40 mils thick. The wafer is secured (loaded) in a pocket of an open-sided paddle having a handle for spinning the loaded paddle inside a beaker containing the cleaning solution. The paddle is of course inert to the cleaning solution.

After preparing the test solution and adding it to the beaker, the wafer is then suspended into the potassium hydroxide/nitrogen-containing solution. Typical cleaning temperatures and times are 80° C. for 90 seconds. While immersed, the wafer is rotated continuously to insure uniformity in cleaning the center portion which is free of the holding surfaces of the paddle. The wafer is afterwards removed from the solution and immediately plunged into a beaker of water to stop the reaction; then rinsed off with deionized water and air dried after treatment with acetone.

EXAMPLES; RESULTS

The cleaning solutions were (by weight) ten percent potassium hydroxide and 2.5 percent nitrogen-containing compound in water. In the examples below, this percent nitrogen-containing compound N-Comp) is used as the characteristic of the example. Smoothness is given in microns determined by a profilometer (Bendix) which averaged the dimensions of peaks and hollows across the wafer surface. Lower microns value means a smoother surface. Brightness was measured by a reflectance meter (PHOTOVOLT Model 670) precalibrated against a magnesium carbonate standard.

The reflectance meter is calibrated to give a reflectance of 98% in the red and green spectral regions and 96% in the blue region. Brightness values are given as percent of the brightness value for magnesium carbonate. A value of 100% indicates a clean wafer.

All profilometer and brightness measurements are made on the cleaned center portion of the wafer.

| Example | N-Comp | Microns* | % Brightness |
|---------|--------|----------|--------------|
| 1 | TMA | 29.2 | 98 |
| 2 | Taurine | 27.3 | 98 |

*Profilometer reading

The same procedure was used for the following examples, the components separately. The potassium hydroxide solution was 10% in water; the others were 2.5%.

| Example | Solution | Microns | % Brightness |
|---------|----------|---------|--------------|
| 4 | KOH | 45.0 | 44 |
| 5 | TMA | 31.0 | 92 |
| 6 | Taurine | 16.0 | 44 |

In connection with the foregoing data, a surface roughness of 31 microns is deemed near or at borderline and represents a wafer of limited cleanliness value, if not a reject. Higher than 31 is rejectable. For example, 2-amino-2-methyl-1-propanol (2.5% by weight in 10% potassium hydroxide aqueous solution) gives a profilometer reading of 40.6 which is too rough. The limit on reflectivity as the second characteristic of cleanliness is about 96%; any lower reading normally results in a rejected wafer.

It was found the TMA species could be diluted up to 20:1 and still maintain surface smoothness and brightness for that species within 96–100% of the values given above. However, reducing the potassium hydroxide concentration to 1% did not result in acceptable cleanability when coupled with taurine because the brightness value was below 50%.

It will be seen from the foregoing that the process is an open one, and that following immersion no more mechanical work is involved than rinsing and air drying.

Hence, while I have disclosed preferred embodiments of the present invention including concentrations, temperatures, and the like, it is to be understood that these are capable of variation and modification within the purview of the appended claims.

I claim:
1. A composition of matter for cleaning silicon IC wafers consisting essentially of an aqueous solution of about 10% by weight potassium hydroxide and 2.5% by weight of a nitrogen-containing compound selected from the group consisting of tetramethylammonium hydroxide and taurine.
2. A method of cleaning silicon wafers comprising the steps of immersing the wafer in a solution claimed in claim 1; afterwards rinsing and drying the wafer.

* * * * *